(12) United States Patent
Andrews et al.

(10) Patent No.: US 8,916,896 B2
(45) Date of Patent: Dec. 23, 2014

(54) LIGHT EMITTER COMPONENTS AND METHODS HAVING IMPROVED PERFORMANCE

(71) Applicant: CREE, Inc., Durham, NC (US)

(72) Inventors: Peter Scott Andrews, Durham, NC (US); Luis Adames, Raleigh, NC (US)

(73) Assignee: CREE, Inc., Durham, NC (US)

( * ) Notice: Subject to any disclaimer, the term of this patent is extended or adjusted under 35 U.S.C. 154(b) by 0 days.

(21) Appl. No.: 13/774,248

(22) Filed: Feb. 22, 2013

(65) Prior Publication Data

US 2014/0239325 A1 Aug. 28, 2014

(51) Int. Cl.
*H01L 33/60* (2010.01)
*H01L 33/56* (2010.01)

(52) U.S. Cl.
CPC .............. *H01L 33/60* (2013.01); *H01L 33/56* (2013.01); *H01L 2933/0091* (2013.01)
USPC .......................................................... 257/98

(58) Field of Classification Search
CPC ...................................................... H01L 33/60
USPC ....................................................... 257/98–99
See application file for complete search history.

(56) References Cited

U.S. PATENT DOCUMENTS

| | | | |
|---|---|---|---|
| 4,946,547 A | 8/1990 | Palmour | |
| 5,200,022 A | 4/1993 | Kong | |
| RE34,861 E | 2/1995 | Davis | |
| 7,183,588 B2 * | 2/2007 | Chia et al. | 257/99 |
| 7,213,940 B1 | 5/2007 | Van De Ven | |
| 7,791,061 B2 | 9/2010 | Edmond | |
| 8,058,088 B2 | 11/2011 | Cannon | |
| 8,227,829 B2 * | 7/2012 | Hata | 257/98 |
| 8,269,245 B1 * | 9/2012 | Shum | 257/98 |
| 8,314,552 B2 | 11/2012 | Shi | 313/512 |
| 8,399,897 B2 * | 3/2013 | Sherrer et al. | 257/98 |
| 8,434,910 B2 * | 5/2013 | Kim | 362/311.02 |
| 8,563,339 B2 | 10/2013 | Tarsa | |
| 8,563,996 B2 * | 10/2013 | Ke et al. | 257/89 |
| 8,598,608 B2 * | 12/2013 | Kuzuhara et al. | 257/98 |
| 8,618,564 B2 * | 12/2013 | Chu et al. | 257/98 |
| 2007/0223219 A1 | 9/2007 | Medendorp | |
| 2008/0173884 A1 | 7/2008 | Chitnis | |
| 2008/0179611 A1 | 7/2008 | Chitnis | |
| 2008/0258130 A1 | 10/2008 | Bergmann | |
| 2010/0155763 A1 | 6/2010 | Donofrio | |
| 2012/0061693 A1 * | 3/2012 | Sherrer et al. | 257/88 |

* cited by examiner

*Primary Examiner* — Nathan Ha
(74) *Attorney, Agent, or Firm* — Jenkins, Wilson, Taylor & Hunt, P.A.

(57) ABSTRACT

Light emitter components and methods having improved performance and related methods are disclosed. In one embodiment, a light emitter component can include a submount and at least one light emitting diode (LED) chip disposed over the submount. The submount can contact at least two different sides of the at least one LED chip. In one aspect, a submount can include surface portions adapted to receive portions one or more LED chips. In one aspect, one or more LED chips can be embedded within the submount.

43 Claims, 5 Drawing Sheets

LIGHT EMITTER COMPONENTS AND METHODS HAVING IMPROVED PERFORMANCE

TECHNICAL FIELD

The subject matter disclosed herein relates generally to light emitter components and methods. More particularly, the subject matter disclosed herein relates to light emitting diode (LED) components and methods having improved performance including improved brightness, light extraction, and/or thermal resistance.

BACKGROUND

Light emitting diodes (LEDs) or LED chips are solid state devices that convert electrical energy into light. LED chips can be utilized in light emitter components for providing different colors and patterns of light useful in various lighting and optoelectronic applications. For example, light emitter components can be used in various LED light bulb and light fixture applications and are developing as replacements for incandescent, fluorescent, and metal halide high-intensity discharge (HID) lighting applications.

Conventional light emitter components utilize one or more LED chips mounted on the surface of a plastic or ceramic substrate or submount. In conventional designs, LED chips are mounted over a submount such that, other than the mounting area, the chips are completely surrounded by and exposed to air prior to any placement of an optical element, such as for example, a dome, lens, or encapsulant filling material if such material is used. In one aspect, LED chips can release heat directly into the air and/or the optical element, where used, both of which are not optimized for heat extraction. Thus, the increased heat can cause the LED chips to lose brightness resulting in poor light extraction and efficiency from the light emitter component.

Thus, despite the availability of various light emitter components in the marketplace, a need remains for emitter components and methods having improved light extraction and efficiency as well as improved thermal resistance.

SUMMARY

In accordance with this disclosure, light emitter components and methods having improved performance are provided and described herein. Components and methods described herein can exhibit improved light extraction and be well suited for a variety of applications such as personal, industrial, and commercial lighting applications including, for example, light bulbs and light fixture products and/or applications. It is, therefore, an object of the present disclosure to provide light emitter components and methods having improved light extraction and thermal resistance, in one aspect, by insetting at least a portion of one or more LED chips within a portion of the component submount. It is also an object of the present disclosure to provide components having improved performance, such as improved light extraction, by providing a better optical surface or emission plane over which phosphor and/or secondary optics can be applied.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
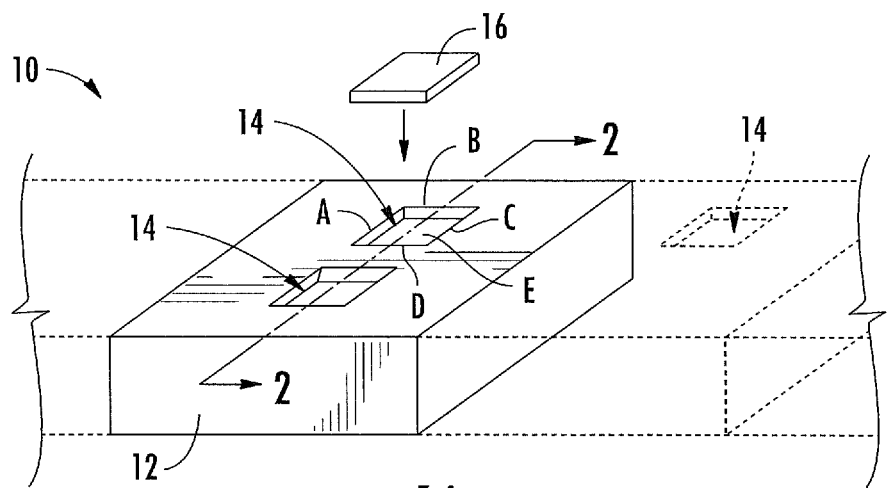
FIGS. 1A and 1B are top perspective views of a portion of a light emitter component according to the disclosure herein.

The subject matter disclosed herein is directed to light emitter components such as light emitting diode (LED) components and methods having improved performance including, for example, improved light extraction, efficiency, and improved thermal resistance. In one aspect, at least a portion or more of one or more LED chips can be inset within a portion of the component such that the LED chip or chips directly contact a ceramic submount of the component at points along at least two different sides for improving thermal resistance and brightness. In further aspects, the density of materials within a green state ceramic submount can be varied to control light scattering, reflectance, and/or output. Components described herein can comprise submount material(s) that is/are substantially transparent and substantially non-absorbing of light emitted by one or more LED chips. Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would be oriented "below" the other structures or portions. Likewise, if components in the figures are rotated along an axis, structure or portion described as "above", other structures or portions would be oriented "next to" or "left of the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, with reference to the submount and material(s) associated with the submount, the material(s) can "reflect" and/or "scatter" light emitted from LED chips which is inclusive of the material "reflecting" and/or "scattering" light emitted from the LED chips. In one aspect, reflective and/or scattering material(s) is/are chosen so as to minimize absorption of emitted light.

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946, 547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. The phosphors can absorb a portion of light from the LED chip and emit a different wavelength of light such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the yellow wavelength spectrum. The components can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899, 790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter components and methods according to the present subject matter can also have multiple LED chips of different colors, one or more of which can be white emitting.

FIGS. 1 through 5 illustrate embodiments of light emitter components and methods according to the present subject matter as disclosed and described herein. FIGS. 1A and 1B are top perspective views of portions of light emitter components, generally designated 10 and 20, respectively. Light emitter components 10 and 20 can comprise non-metallic based (e.g., ceramic) submounts 12 and 22, respectively, comprised of a non-metallic material. Submounts 12 and 22 can be provided with or without metal layers disposed at the die attach surface and/or with or without metal layers disposed at areas within the submount (e.g., with or without one or more internal metallic vias). In one aspect, submounts 12 and 22 can comprise portions of material which can be singulated from a large, non-metallic panel (i.e., as indicated in broken lines), however, individually formed or pressed submounts are also contemplated herein. Generally, it is desirable to incorporate a substrate or submount 22 that is highly reflective to visible light (e.g., greater than about 90%) and which can provide conduction of heat as well as mechanical support. In one aspect, ceramic materials containing aluminum oxide (e.g., alumina or $Al_2O_3$) exhibit such desirable qualities. Accordingly, submounts 12 and 22 can comprise a ceramic based body of material such as $Al_2O_3$ (and/or containing $Al_2O_3$) or ZrO.

FIG. 1A illustrates a first embodiment of a submount 12 for a light emitter component 10. Submount 12 can comprise a non-metallic and/or ceramic material, such as aluminum oxide (hereinafter "$Al_2O_3$"), and can comprise any suitable size, shape, orientation, and/or configuration. For illustration purposes, a substantially rectangular or square shaped submount 12 is shown, however, any shape of submount is contemplated herein, for example, any one of a substantially circular, oval, rounded, regular, irregular, or asymmetrically shaped submount is contemplated herein. Notably, submount 12 can comprise one or more surface feature or portion disposed in at least one surface of submount 12. For example and in one aspect, submount 12 can comprise at least one recess generally designated 14 disposed in a top surface of submount 12. Recess 14 can be adapted to receive one or more LED chips 16 that can be embedded within submount 12 and inset with respect to at least one surface of submount 12. In one embodiment, submount 12 can comprise more than recess 14 or an array of recesses 14 configured to receive an array of LED chips 16. In further embodiments, submount 12 can comprise recesses 14 in more than one surface (e.g., angled or adjacent surfaces) such that the LED chips 16 can be embedded and angled with respect to each other along more than one surface of submount 12. In one aspect, a bottom surface of LED chips 16 can be located and disposed along a first plane that is different from a second plane along which an upper surface of submount 12 is disposed. A top surface of LED chip 16 can be adjacent to and/or coplanar with the upper surface of submount 12. In further aspects, a top surface of LED chip 16 can be adjacent to but located along a third plane that is different from and disposed above the plane along which upper surface of submount 12 is disposed.

Submount 12 can be configured to directly contact more than one side and/or different sides of one or more LED chips 16 along portions of three, four, or five sides or surfaces (e.g., three, four, or five interfaces between submount 12 and LED chip 16) such that submount 12 can be directly disposed about and/or directly adjacent to one or more portions of LED chip 16. For example, LED chip 16 can be embedded or inset within recess 14 such that submount 12 contacts each LED chip 16 at five contact points or surfaces denoted by letters A through E. In this embodiment, five surfaces or portions of recess 14 (e.g., surfaces A to E) can directly contact LED chip 16 in at least five points or along at least five interfaces. In further aspects, LED chip 16 can be partially disposed within recess 14 such that it interfaces with submount 12 at only four points (e.g., along four lateral sides), for example, where LED chip 16 contacts surfaces A to D but not E. This can occur, for example, in instances where LED chip 16 is partially suspended within recess 14 (e.g., see FIG. 3C). LED chip 16 can be mounted over a portion of at least one surface of submount 12 (e.g., surface E and/or one or more surfaces A to D of recess 14) via an index matched epoxy or adhesive during a die attach processing step. Notably, embedding or insetting one or more LED chips 16 within a portion of submount 12 can improve thermal resistance of component 10 as submount 12 can directly contact portions of chip 16 and can dissipate heat more readily than conventional components in which LED chips are surrounded with air and/or optical elements such as silicone encapsulant materials or lenses. Improved thermal resistance advantageously allows LED chips 16 to run cooler during illumination, which, in turn, allows light emitter component 10 to comprise an improved brightness and light extraction.

In one aspect, surface portions such as the one or more recesses 14 can be provided while submount 12 is in a green state (e.g., prior to firing or sintering). Submount 12 can be provided and formed using a die-press adapted to press the green state ceramic material such as a ceramic filler material (e.g., aluminum oxide or alumina particles) mixed with a ceramic binder material and/or sintering inhibitor. Notably, the die-press used to press the green state ceramic can include protrusions or other suitably shaped areas about which material can be compacted to form surface portions, for example, recesses 14 in one or more surfaces of submount 12.

In further aspects, surface portions, such as one or more recesses 14, can be provided after submount 12 is fired or sintered. For example, submount 12 can comprise a ceramic body cast using low temperature co-fired ceramic (LTCC) materials or high temperature co-fired ceramic (HTCC) materials and processes. In one embodiment, submount 12 can be individually cast from a thin green ceramic tape and subsequently fired. Submount 12 can also be cast and subsequently fired and singulated from a panel of submounts formed from a thin green ceramic tape. Surface portions, such as one or more recesses 14, can be mechanically formed in the finished fired panel or submount 12 via mechanical processing techniques including, for example and not limited to, machining, grinding, sawing, drilling, punching, stamping, or any other suitable processing technique to physically remove a portion of submount 12. The one or more recesses 14 can also be chemically formed via a chemical processing technique, such as and not limited to, chemical etching or any other suitable method to physically remove a portion of submount 12 via chemical processing.

Where used, the ceramic tape can comprise any suitable ceramic filler material, for example, glass ceramics such as $Al_2O_3$ or aluminum nitride (AlN) having 0.3 to 0.5 weight percent of glass frits. The glass frits can be used as a binder and/or sintering inhibitor within the ceramic tape when the tape is fired. A green tape can be formed by casting a thick layer of a slurry dispersion of the glass frit, ceramic filler, one or more additional binders, and a volatile solvent. In one aspect, LED chips 16 can be directly pressed into a thick slurry of material to increase efficiency. The cast layer can be heated at low temperatures to remove the volatile solvent. A green ceramic tape used for submount 12 can advantageously comprise any thickness desired, thus contributing to a thinner size when desired. Submount 12 can further comprise a ceramic material having any of a variety of scattering particles contained therein. Examples of suitable scattering particles can for example comprise particles of $Al_2O_3$, $TiO_2$, $BaSO_4$, and/or AlN. Submount 12 can be produced by thin- or thick-film processing techniques available at and including products available from CoorsTek, headquartered in Golden, Colo. Such substrates or submounts can optionally be fired along with other materials (e.g., Zirconia) to improve optical and mechanical properties.

Figure 1B:
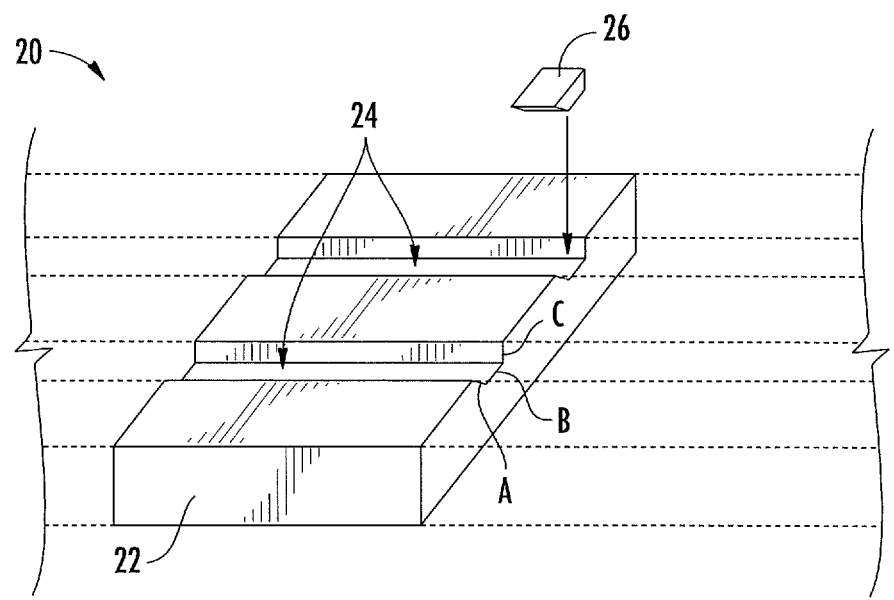

As another example, FIG. 1B is a second embodiment of submount 22 for light emitter component 20. Notably, submount 22 can comprise one or more surface portions disposed in at least one surface of submount 22. In some aspects, surface portions can be disposed in more than one surface of submount 22 such that the surface portions can be angled with respect to each other and/or disposed along different planar surfaces. For example and in one aspect, submount 22 can comprise at least one channel, slot, or groove generally designated 24 configured to receive at least one LED chip 26. In one aspect, submount 22 can comprise more than one groove 24. Groove 24 can be configured to receive more than one LED chip 26, such as a plurality of LED chips 26 optionally arranged as an array of chips. Groove 24 can comprise beveled and/or straight cut sides or surfaces denoted by letters A through C that can be adapted to receive LED chips 26 having corresponding beveled and/or straight cut sides.

Light emitter component 20 can be configured to receive LED chips 26 such that at least portions of chips are inset and/or embedded within portions of submount 26. In one aspect, one or more LED chips 26 can be embedded within groove 24 such that submount 22 directly contacts each LED chip 26, for example at three contact points, sides, or surfaces denoted by letters A to C. In this embodiment, three surfaces or portions of groove 24 (e.g., surfaces A to C) can directly contact LED chip 26 in at least three points or along at least three interfaces. Optionally, and in further aspects, one or more LED chips 26 can be partially disposed within groove 24 such that each such LED chip 26 directly contacts submount 22 at only two points (e.g., along curved or beveled sides), for example, where LED chip 26 contacts surfaces A and C but not B. This can occur, for example, in instances where LED chip 26 is partially suspended within groove 24 or in instances where groove 24 consists of two sides and does not have a bottom surface (e.g., a V-shaped groove or notch having a V-shaped cross section with no flat bottom surface B).

In one aspect, surface portions, such as one or more grooves 24, can be provided while submount 22 is in a green state (e.g., prior to firing or sintering). Similar to submount 12 described above, submount 22 can be provided and formed using a die-press. The die-press used to press the green state ceramic can include protrusions (e.g., V-shaped or straight-sided ridges) or other suitably shaped areas about which material can be compacted to form grooves 24 in one or more surfaces of submount 12. In the alternative, the greens state ceramic material can be pressed and then scored using a V-score or rectangular score to form grooves 24 in the green state ceramic. The green state submount 22 can be subsequently fired.

In further aspects, surface portions such as one or more grooves 24 can be provided after submount 22 is fired. For example, submount 22 can comprise a ceramic body cast using low temperature co-fired ceramic (LTCC) materials or high temperature co-fired ceramic (HTCC) materials and processes. In one embodiment, submount 22 can be individually cast from a thin green ceramic tape and subsequently fired. Submount 22 can also be cast and subsequently fired and singulated from a panel of submounts formed from a thin green ceramic tape. Surface portions, such as one or more grooves 24, can be mechanically formed in the finished fired panel or submount 22 via mechanical processing techniques, such as but not limited to, machining, grinding, sawing, drilling, punching, stamping, or other suitable processing technique for physically removing one or more portions of submount 22 and form, for example, a "nest" adapted to receive LED chips 26. The one or more grooves 24 can also be chemically formed via a chemical processing technique such as chemical etching, or any other suitable technique for physically remove a portion of submount 22 via chemical processing.

In one aspect, submounts 12 and 22 can comprise an optically thick layer of a substantially transparent material, containing, for example, $Al_2O_3$, which can be configured to scatter and/or reflect back as much light as possible and to the greatest degree from the respective submount. Notably, submounts 12 and 22 disclosed herein can comprise internal scattering or reflecting areas (18, see e.g., FIG. 2) such that light emitted by one or more embedded or inset LED chips 16 or 26 can enter into the submount 12 or 22 and scatter or reflect back out from one or more surfaces of the submount. In one aspect, the term "optically thick" refers generally to the situation where the layer thickness has negligible effect on the color, yet very thin films appear mostly transparent.

Ceramic-based light emitter components 10 and 20 (e.g., comprising ceramic based submounts) described herein can provide improved light scattering and reflection and, therefore, improved efficiency, brightness, and light extraction capabilities. Whereas components comprised of metal reflectors usually produce only about 95% total reflection (i.e., diffuse plus specular), components comprised of ceramic-based reflectors (e.g., submounts) can produce upwards of 99% or higher total reflection. To further improve the total reflection or light extraction, components 10 and 20 can be designed to receive and reflect light emitted from sides of LED chips 16 or 26 within submount 12 or 22 by insetting chips within portions of the respective submount. Notably, portions of submounts 12 or 22 can be disposed about and/or directly adjacent one or more sides of the LED chips 16 and 26. In further aspects, total reflection and light extraction capabilities can be further improved by increasing porosity and/or density of the green state submount 12 or 22 to further increase the amount of diffuse reflection. Ceramic based submounts are also desirable for use in light emitter components described herein for improved thermal management properties. For example, $Al_2O_3$ materials exhibit relatively low thermal resistance, low moisture sensitivity, superior reliability at high temperature environments, and the superior ability to dissipate heat.

Figure 2:
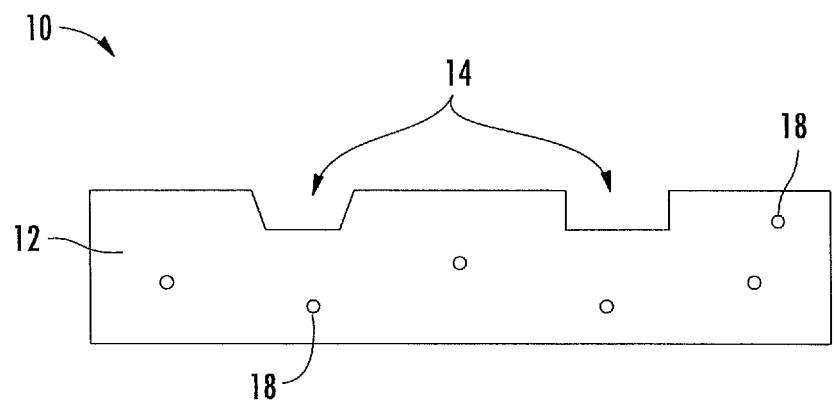
FIG. 2 is a cross-sectional view of a portion of a light emitter component according to the disclosure herein.
Figure 3A:
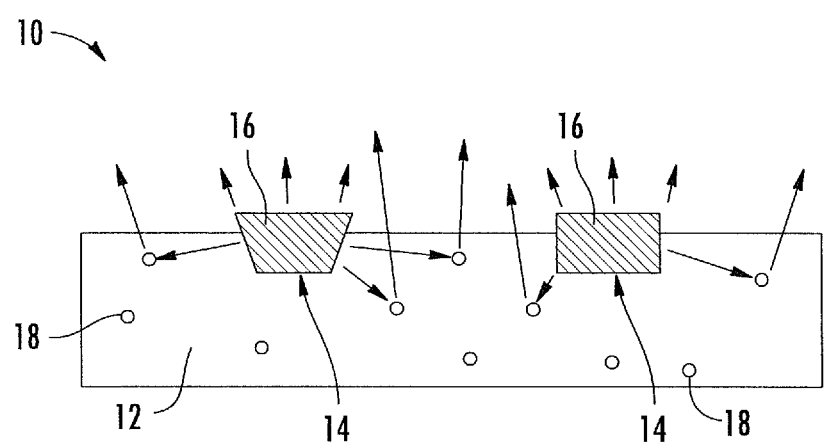
FIGS. 3A to 3D are cross-sectional views of different embodiments of light emitter components according to the disclosure herein.

FIG. 2 is a side view of light emitter component 10 prior to placement of one or more LED chips 16 (FIG. 3A). FIG. 2 is a cross-sectional view of submount 12 having one or more surface portions disposed therein. Surface portions can comprise one or more recesses 14 or grooves 24 (FIG. 1B) disposed in an upper surface of submount 12. In an alternative embodiment, surface portions can be provided in more than one adjacent and/or opposing sides or surfaces of submount 12 such that LED chips 16 (FIG. 3A) can be embedded along non-coplanar surfaces and/or surfaces that are angled with respect to each other for emitting light from different areas and/or at different angles from submount 12. Recesses 14 can comprise any cross-sectional shape having two or more sides (e.g., a V-shaped notch or groove) and can be adapted to receive any size or shape of LED chip (e.g., 16, FIG. 3A). In one aspect, recess 14 can comprise straight or beveled (e.g., sloped or inclined) sides adapted to engage or contact one or more corresponding shaped LED chips (e.g., 16, FIG. 3A) having straight or bevel cut sides. Recess 14 can be adapted to receive any suitable size and/or shape of LED chip (e.g., 16, FIG. 3A) such as substantially square or rectangular shaped chips with or without bevel cut sides. In one aspect, recess 14 can be adapted to receive a square shaped LED chip (e.g., 16, FIG. 3A) having a footprint including sides of approximately equal to 1000 μm or less (e.g., 1000×1000 μm$^2$) or any larger or smaller sized chip. For example, recess 14 can be adapted to receive LED chips 16 described comprising substantially square or rectangular chips having straight cut or beveled lateral sides and footprints comprising any range or sub-range less than approximately 1000 μm, for example, LED chip 16 can comprise an approximately 900×900 μm2 chip; an approximately 700×700 μm2 chip; an approximately 600×600 μm2 chip; an approximately 500×500 μm2 chip; an approximately 400×400 μm2 chip; an approximately 300×300 μm2 chip; an approximately 200×200 μm2 chip; or an approximately 100×100 μm2 chip. Multiple LED chips 16 can be utilized in light emitter components 10 described herein and chips 16 can comprise straight or bevel cut sides. In one aspect, each LED chip 16 can be the same size. In other aspects, one or more LED chips 16 can be different sizes. As noted earlier, submount 12 can comprise any size and any shape. For example, submount 12 can comprise a substantially square or rectangle shape having at least one side of approximately 25 millimeters (mm) or less such as approximately 20 mm or less, approximately 15 mm or less, approximately 10 mm or less, approximately 5 mm or less, or a submount having at least one side of approximately 1 mm or less.

FIGS. 3A to 3D are cross-sectional views of light emitter component 10 comprising one or more LED chips 16 contacting and/or optionally disposed within one or more surface portions, such as recesses 14, of submount 12. Notably, components described herein can comprise submounts, such as submount 12, which are configured to receive light within a portion of the internal body or structure of submount 12 from an adjacent and embedded or inset LED chip 16. Submounts disclosed herein can then internally reflect or scatter light received from the embedded chip such that light which goes into the submount 12 can scatter and/or reflect and thereby be emitted back out from the submount 12. Submount 12 can comprise internal scattering or reflecting areas 18. Areas 18 can comprise one or more areas of optical material such as light scattering particles (e.g., particles of $Al_2O_3$, $TiO_2$, $BaSO_4$, and/or AlN), areas comprising grain boundaries disposed between ceramic filler material, areas comprising porosity, and/or any other suitable area that can reflect and/or scatter light. Submount 12, therefore, can receive light emitted by at least one LED chip 16 and re-emit that light from surfaces of submount 12 as indicated by the arrows. For illustration purposes, internal scattering or reflecting areas 18 are schematically illustrated and visible, however, such areas may not be visible to the naked eye and can comprise transparent areas within submount 12.

In one aspect, one or more portions of submount 12 can be disposed directly adjacent to and/or directly contact one or more sides of one or more LED chips 16 such that submount substantially surrounds the inset or embedded chips. Recesses 14 and/or grooves 24 (FIG. 1B) can be directly disposed about two or more different sides of LED chips 16, and can, for example, form two, three, four, five, or more than five points of contact with LED chip 16. The bottom surface of recesses 14 and/or grooves 24 (FIG. 1B) can be located and disposed along a first plane that can be different than a second plane along which upper surface of submount 12 is disposed. LED chips 16 can be embedded within or inset directly adjacent to portions of submount 12. Recesses 14 and/or grooves 24 (FIG. 1B) can be disposed in more than one side or surface of submount 12.

As FIG. 3A illustrates, recesses 14 can be disposed directly adjacent portions of at least three surfaces or sides of LED chip 16 (e.g., opposing lateral surfaces and bottom surface). Notably, recesses 14 can comprise substantially straight cut or bevel cut sides adapted to receive chips 16 having at least partially correspondingly shaped sides or surfaces. Thus, light can advantageously enter submount 12 and reflect or scatter back out from internal surfaces of submount 12. LED chip 16 can receive electrical current or signal from an external power source (not shown) via an electrical contact or connection such as a wirebond (not shown). In other aspects, electrical connectors such as wirebonds may not be required where the cathode and anode are disposed on a bottom surface of the LED chip. The electrical current or signal can be adapted to illuminate the LED chips 16 causing LED chips 16 to emit light as indicated by the arrows.

Light can be emitted from the top surface and embedded lateral surfaces of LED chips 16. FIG. 3A illustrates an embodiment where sides or surfaces of LED chips 16 can be partially embedded within submount 12, such that upper surfaces of LED chips 16 are disposed along a plane that is above the upper surface of submount 12. Thus, a depth of recess 14 can, for example, be less than a height of the LED chip 16. As indicated by the arrows, light can be emitted from sides of LED chips 16 and travel into portions of adjacent submount 12. The light can be scattered and/or reflected by internal scattering or reflection areas 18. Areas 18 can cause the light to then be re-emitted from submount 12. Thus, light travels into submount 12 and back out of submount 12.

Figure 3B:
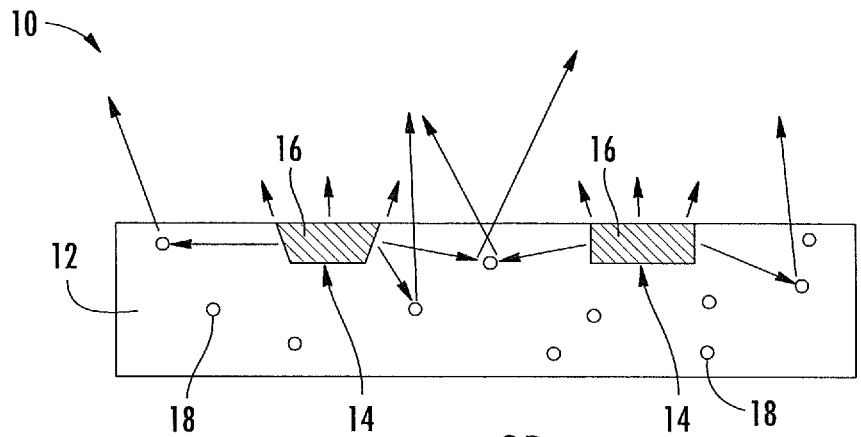

FIG. 3B illustrates an embodiment of emitter component 10 where a depth of recess 14 is approximately equal to or greater than the height of the LED chips 16. That is, LED chips 16 can be fully embedded within submount 12, such that the full length of lateral surfaces or sides of the chips 16 can be disposed directly adjacent portions of submount 12. Light emitted into submount 12 can encounter light scattering or reflecting areas 18 and become reflected or scattered back out of submount 12. Areas 18 can comprise areas of one or more particles adapted to scatter light, areas of grain boundaries which form during firing or sintering process, and/or areas of porosity which occur during formation of submount 12. In this embodiment, an upper surface of LED chips 16 can be coplanar with an upper surface of submount 12. In some aspects, the chip can be non-coplanar with an upper surface of submount 12. For example, an upper surface of LED chip 16 can be disposed above and/or below upper surface of submount 12. One or more reflective layers can be provided within submount 12, for example, below the one or more LED chips 16 for further improving brightness.

Figure 3C:
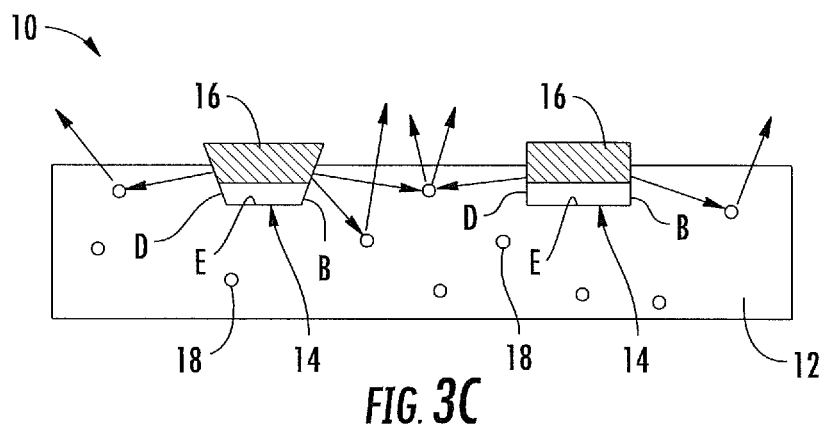

FIG. 3C illustrates a further embodiment of emitter component 10 where LED chips 16 are only partially received in one or more recesses 14. That is, LED chips 16 can be directly adjacent at least two surfaces D and B of submount 12 but are not fully received within and adjacent the bottom surface E of recess 14. In one aspect, a gap can exist between LED chip 16 and a bottom surface of recess 14. Light emitted by lateral side surfaces of LED chips 16 can still enter into portions of submount 12 and can become reflected back out by areas 18.

Notably, embedding even a portion of one or more LED chips 16 within submount 12 can allow heat to be conducted more efficiently within component 10 thereby improving thermal resistance and brightness of the component. As light is reflected and not absorbed from areas 18 of submount, light extraction of component 10 is also improved.

Figure 3D:
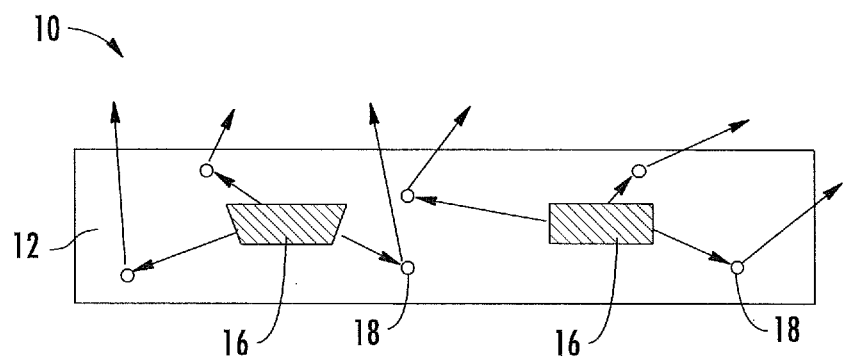

FIG. 3D illustrates yet a further embodiment of emitter component 10, where LED chips 16 can be fully embedded within portions of submount 12. For example, LED chips 16 can be incorporated within the green state ceramic material and then pressed and fired such that submount 12 can fully encase or surround LED chips 16. In this embodiment, submount 12 can be disposed adjacent all four lateral sides of chip 16 (e.g., for a square or rectangular ship) as well as the top and bottom surfaces. Accordingly, component 10 can comprise at least six points of contact or interfaces between submount 12 and one or more LED chips 16.

Referring generally to FIGS. 3A to 3D, in one aspect, light emitter component 10 can comprise chips 16 arranged in arrays and/or sub arrays disposed over and/or within submount 12. Light emitter components 10 described herein can comprise any number of LED chips 16, for example, at least one LED chip 16, at least two LED chips, more than two LED chips, three LED chips, four LED chips, five LED chips, six LED chips, eight LED chips, 10 LED chips, twelve LED chips, more than twelve LED chips, for example, an array of twenty or more LED chips such as thirty, forty, or fifty LED chips 16.

Figure 4A:
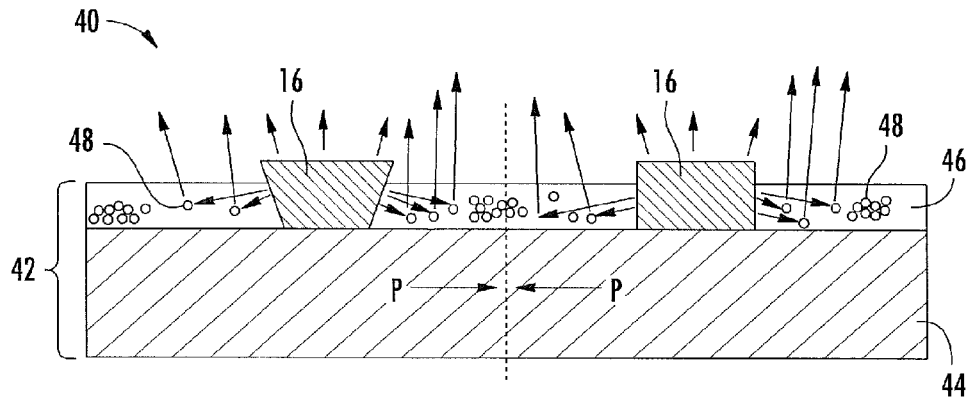
FIGS. 4A to 4C are cross-sectional views of different embodiments of light emitter components incorporating a coupling material according to the disclosure herein.
Figure 4B:
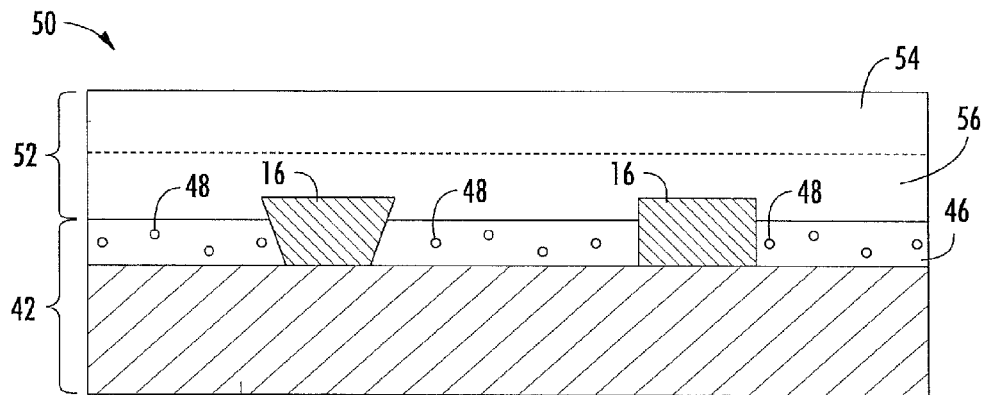
Figure 4C:
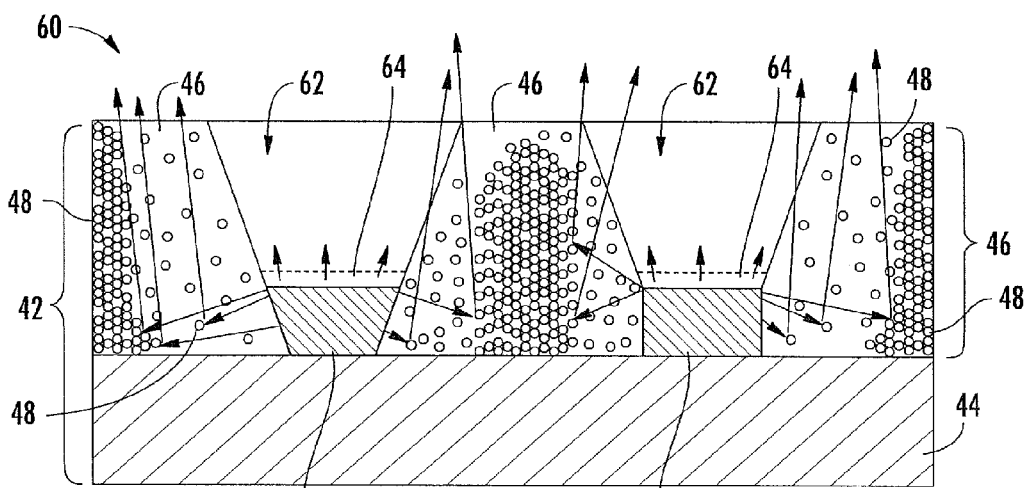

FIGS. 4A to 4C illustrate different embodiments of light emitter components comprising a submount 42 having more than one layer of material (e.g., a multi-layered submount). For example, submount 42 can comprise a first portion and a second portion. First portion of submount 42 can comprise base layer 44 of material and second portion of submount 42 can comprise a coupling layer 46 of material disposed over the base layer for increasing the optical thickness of components described herein. In one aspect, base layer 44 can comprise a hard plate $Al_2O_3$ material and coupling layer 46 can comprise a layer of densely packed $Al_2O_3$ particulates in a green-state consistency that can be pressed for dense packing. Coupling layer 46 can advantageously couple sides or surfaces of one or more LED chips 16 (e.g., a bottom surface of LED chip 16) to the $Al_2O_3$ plate or base layer 44. At least a first portion of at least one LED chip 16 can be embedded in coupling layer 46 while at least a second portion of the chip can be mounted to or disposed over base layer 44. In one aspect, coupling layer 46 can also improve light extraction and/or control an area and beam shape of light output from components described herein by incorporating areas of increased loading or densely packed areas of optical material 48.

In some aspects, a reflective material or layer of material can be provided within a portion of base layer 44, within a portion of coupling layer 46, and/or between portions of base layer 44 and coupling layer 46 for further improving brightness. For example, and in some aspects a Ag reflective component or Ag layer can be provided and/or buried at a level below chips 16. In some aspects, a Ag layer or component can be provided along a bottom of submount 44, such as along a bottom surface where light emitter component will connect or mount to another device. The reflective material and/or reflective layer can reflect light (versus index-scattering), thus, it can be mirror like and also useful for spreading heat and/or being used as a conducting trace for electrical connectivity.

FIG. 4A illustrates a light emitter component generally designated 40, FIG. 4B illustrates a light emitter component generally designated 50, and FIG. 4C illustrates a light emitter component generally designated 60. Each component can comprise submount 42 having a base layer 44 disposed below and/or formed as a distinct layer adjacent coupling layer 46. Light emitter components 50 and 60 can comprise additional features such as optical elements including lenses, phosphor layers, and/or secondary optics. Notably, submount 42 can provide an improved optical surface providing a substantially flat surface for easy and precise application of encapsulant or lens material and/or optical conversion material, such as phosphoric or lumiphoric material. As LED chips 16 can be embedded within a portion of submount 42, there can be less surface area of the chip above the submount which results in a flatter and/or more uniform surface. This can contribute to improved application of optical conversion materials including improved phosphor application and precision of phosphor application.

Base layer 44 can comprise a ceramic plate, such as a hard fired plate of $Al_2O_3$ or other ceramic based plate of material. Base layer 44 can comprise a substantially transparent layer of material that does not absorb light. As noted above and in one aspect, coupling layer 46 can comprise densely packed $Al_2O_3$ particulates that can be pressed. In other aspects, coupling layer 46 can comprise a layer of any transparent high index material, for example only, and not limited to titanium dioxide ($TiO_2$) particles in a matrix of silicone or glass. In one aspect, coupling layer 46 can comprise any matrix material that is transparent to and substantially non-absorbing of light emitted by LED chips 16. Coupling layer 46 can further comprise any material having a higher index of refraction than the matrix surrounding it so as to reflect and/or scatter light emitted from LED chips 16. In one aspect, the material having the higher index of refraction can comprise optical material 48. Optical material 48 can comprise light scattering particles such as $TiO_2$, optical conversion material such as phosphoric or lumiphoric material, or combinations thereof dispersed within the body of coupling layer 46. Coupling layer 46 can be attached to base layer 44 during a pressing step, or coupling layer 46 can be attached to base layer 44 via an adhesive or other suitable method or material placed between the layers for causing such layers to adhere.

Optical material 48 can be dispersed in an organic, inorganic, or combination of organic and inorganic matrix material. Preferably, the matrix can comprise an index of refraction (n) that is lower than an index of refraction associated with optical material 48. In one aspect, optical material 48 can be disposed in a matrix material having an index of refraction, for example of approximately 1.6 or less, and in one aspect approximately 1.5 or less. The combination of matrix and optical material 48 can provide a coupling layer 46 that is generally opaque and/or translucent in appearance, in part due to the loading and/or average particle size of material 48. The combination of matrix and highly reflective material, such as optical material 48 comprised of light scattering particles, can provide a highly reflective substrate having improved reflection thereby having improved light extraction per emitter component or device.

In one aspect, coupling material 46 can comprise a suitable matrix material such as an organic polymer, for example, one or more materials including silicones, siloxanes, polyesters, polyurethanes, acrylics (e.g., polyacrylates, polymethacrylates), epoxies, fluoropolymers, polyolefins, co-polymer, any precursor materials, and/or combinations thereof. In one aspect, polydimethylsiloxanes, polydimethylphenylsiloxanes, polyphenylsiloxanes, or blends are employed. Other polydialkyl-, polydialkylphenyl-, polydialkylalkylphenyl-, and polyalklyphenyl-siloxane polymers can be substituted for the above matrix. Mixtures, co-polymers, and blends of siloxanes can be used. In one aspect, polydimethylsiloxanes and/or polyphenylsiloxanes have sufficient pre-cure viscosities for introduction into light emitter components that cure to a gel or hard durometer layer and may be preferred. In one aspect, the matrix material of coupling layer 46 can be transparent to the light emitted by the one or more LED chips 16 embedded or inset within coupling material 46 of components described herein. As FIG. 4A illustrates, light can be emitted from embedded LED chips 16 into coupling layer 46 of submount 42 and then be scattered or reflected back out from coupling layer 46 of submount 42. In one aspect, light can be scattered from optical material 48 comprised of light scattering particles (e.g., $Al_2O_3$ or $TiO_2$) and become reflected back out of portions of submount 42. By controlling a packing density or loading of optical material 48, light can be reflected out of certain predefined portions of submount 42 allowing for specific beam shapes, patterns, or areas of light.

Optical material 48 can comprise a high index of refraction material having an index of refraction, for example of approximately 1.8 or greater, approximately 2 or greater, approximately 2.2 or greater, and/or approximately 2.4 or greater. Suitable examples of high index of refraction material include inorganic compounds such as $TiO_2$ (n=2.4), zinc oxide, zinc sulfide, barium sulfate, boron nitride, talc, silica, $Al_2O_3$, zeolite, calcium carbonate, magnesium carbonate, barium sulfate, zinc oxide, titanium oxide, aluminum hydroxide, magnesium hydroxide, mica, montmorillonite, clay, carbon particles, glass particles, carbon nanotubes, and/or combinations thereof.

The amount of optical material 48 comprising one or more high index of refraction materials can at least depend, in part, on the choice of matrix chosen. For example, to provide suitable reflectivity and/or scattering, optical material 48 can be optically transparent for minimizing or eliminating absorption of light during operation of the LED chips 16. In one aspect, the loading of optical material 48 within a matrix material can vary between approximately 3 weight percent (wt. %) and approximately 50 wt. %. In one aspect, approximately 6 to 15 wt. % of optical material 48 can be used in matrix of coupling layer 46. In one aspect, optical material 48 can comprise a predetermined amount of $TiO_2$ averaging in size between approximately 1 nanometer (nm) and about 500 microns ($\mu$). In certain aspects, optical material 48 can comprise $TiO_2$ particles of approximately 0.1 to 10$\mu$, 0.5 to 5$\mu$, or a size distribution mixture can be used. The $TiO_2$ can be added to a two part, clear silicone matrix (e.g., Part A=silicone; Part B=epoxy resin), and can be added to either part (e.g., Part A and/or Part B) or both parts of the two-part matrix. Accordingly, optical material 48 can comprise light scattering particles that are uniformly loaded (e.g., FIG. 4B) or variably loaded (e.g., FIGS. 4A and 4C) within portions of submount.

As FIGS. 4A and 4C illustrate, the packing density or wt. % loading of optical material 48 can vary over portions of submount 42. For example, arrow P of FIG. 4A points from areas of lower packing density or loading to areas of increased packing density or loading. Packing density or wt. % loading of optical particles 48 can increase as distance away from each LED chip 16 increases. More densely packed areas and/or more highly loaded areas (e.g., along broken centerline between arrows P) can scatter more light during operation of component 40, and can cause light to be emitted from predefined areas (e.g., areas proximate each LED chip 16) of component 40. In one aspect, the more densely packed areas can correspond to substantially opaque areas of component 40 which can scatter more light, and cause light to be reflected from the less densely packed areas only (e.g., light encounters dense areas and reflects out from less dense areas, or portions of submount) for controlling light output. For example, during operation of component 40, light emitted from one or more LED chips 16 can be scattered or reflected to a greater degree from the densely packed areas and therefore become emitted or reflected back out from the less densely packed areas (e.g., transparent areas). As such, light can become extracted or reflected from predisposed portions of submount 42 (e.g., portions of coupling layer 46 that are closer to each LED chip 16). Thus, light can advantageously become controlled or selectively reflected out from certain predefined portions of submount 42 which can, notably, provide specific beam shapes, patterns, or areas of light.

FIG. 4B illustrates a light emitter component 50 comprising a multi-layered submount 42 as previously described. Notably, coupling layer 46 comprises a layer having substantially uniform density or loading wt. % of optical particles 48, such as $Al_2O_3$ or $TiO_2$ particles as previously described. Thus, light can be uniformly reflected from surfaces of submount 42. Component 50 can further comprise an optical element 52 or secondary optics disposed over the one or more LED chips 16. Optical element 52 can comprise a layer 54 of encapsulant (e.g., suitable methyl or phenyl silicones) or a silicone lens. Optical element 52 can protect submount 42 and/or chips 16 from mechanical and/or chemical damage. Optical element 52 can also improve light extraction and/or light placement, pattern, or shape of light beams or light emission. The broken line in FIG. 4B indicates placement of an optional layer of optical conversion material 56, such as phosphor, can be applied over LED chips 16 and submount 52 if desired. In one aspect, layer 54 can extend and contact one or more portions of upper surface of submount 42 (e.g., upper surface of coupling layer 46).

LED chips 16 as described herein can embody a solid state emitter used alone and/or in combination with optical conversion material 56 comprising, for example, phosphors or lumiphors to emit light of various colors, color points, or wavelength ranges, such as light that is primarily white, blue, cyan, green, yellow, amber, or red. In one aspect light emitter components described herein can comprise one or more LED chips 16 that are primarily blue, which when illuminated, can activate a yellow phosphor disposed over the one or more chips 16 (e.g., phosphor can be at least partially directly disposed over LED chips 16 and/or on a portion of light emitter component 50 that is disposed over LED chips 16 such that the chips comprise blue shifted yellow (BSY) chips. In alternative embodiments, a primarily LED chip 16 can be included in emitter components described herein and can be used alone and/or combination with a BSY chip. In one aspect, a red LED chip 16 can also optionally be disposed below a phosphor, encapsulant, lens and/or combinations thereof, such as optical element 52 with a phosphor layer for mixing to produce warm white output. Light emitter component 50 can comprise at least one LED chip 16 configured to activate a yellow, red, and/or green phosphor either disposed directly over LED chip 16 and/or directly over a portion of emitter component 50 for producing cool and/or warm white output. In yet a further embodiment, component 50 can comprise more than one LED chip 16 such as a plurality and/or array of LED chips 16. Each chip in the plurality or array of LED chips 16 can comprise approximately the same wavelength (e.g., selected from the same targeted wavelength bin). In the alternative, at least a first LED chip 16 of the plurality of chips can comprise a different wavelength than at least a second LED chip of the plurality of chips (e.g., at least a first LED chip 16 could be selected from a different targeted wavelength bin than at least one other LED chip 16).

In one aspect, portions of submount 42 (e.g., coupling layer 46) can be substantially coplanar or only slightly non-coplanar with the top surface of each embedded LED chip 16. As previously described with respect to FIG. 3B, the upper surfaces of LED chips 16 can be substantially coplanar with an upper surface of the component submount. Thus, embedding or insetting LED chips 16 can advantageously reduce a height of the chip 16 extending above a surface of submount 42. This can improve or function as secondary optics. For example, this configuration provides components having enhanced brightness by increasing the amount of reflected light. A submount 42 having a portion or surface that is substantially coplanar or only slightly non-coplanar with the top surface of one or more LED chips 16 can advantageously provide substantially flat surfaces for improving the ease and precision at which optical element 52 or portions of optical element 52 (e.g., optical conversion layer 56) can be applied.

FIG. 4C illustrates a light emitter component 60 comprising a multi-layered submount 42. In this embodiment, coupling layer 46 can extend above portions of each LED chip 16. In one aspect, LED chips can be pressed into coupling layer 46 when coupling layer is in a green state such that they are embedded or inset within coupling layer 46 above and directly contacting an upper surface of base layer 44 but below an upper surface of coupling layer. At least three sides of each LED chip 16 can be surrounded by at least portions of submount 42. For example, in one embodiment, opposing lateral sides of each LED chip 16 can contact coupling layer 46 and a bottom surface can contact base layer. Optical material 48 disposed within coupling layer 46 of submount can comprise variable loading and/or packing densities such that portions of coupling layer 46 are highly loaded or dense and other portions are not. More dense or loaded portions of submount 42 will scatter light to a greater degree than less dense or loaded portions. Thus, light emission, beam pattern, or beam shape can be controlled by varying the packing density or loading of particles or optical material 48 within portions of submount 42.

Light emitter component 60 can further comprise an optical element 62. Optical element 62 can comprise a layer of encapsulant filling material or a suitably shaped lens. As indicated by the broken line, an optional layer of optical conversion material 64 can be disposed over LED chips 16. In one aspect, optical element 62 can comprise a layer of silicone encapsulant or epoxy that is substantially flat with a portion of submount 42. Light emitter component 60 can comprise at least one LED chip 16 configured to activate a yellow, red, and/or green optical conversion material 64 (e.g., yellow, red, and/or green phosphor) either disposed directly over LED chip 16 and/or directly over a portion of emitter component 60 for producing cool and/or warm white output.

Figure 5:
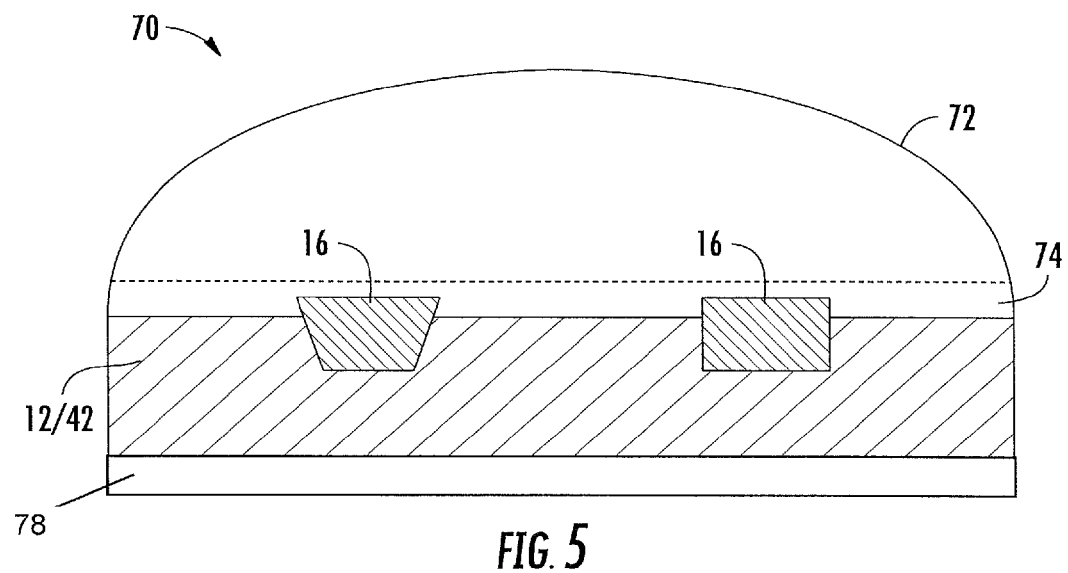
FIG. 5 is a cross-sectional view of a further embodiment of a light emitter component according to the disclosure herein.

FIG. 5 illustrates a light emitter component, generally designated 70. Light emitter component 70 can comprise a submount, such as previously described submounts 12 and 42. LED chips 16 can be embedded within portions of submount such that submount 12/42 interfaces or contacts at least three different sides of chip 16. Light emitter component 70 can comprise an optical element 72. Optical element 72 can comprise a domed lens for producing a certain shape or beam pattern of light emission. As indicated by the broken line, a layer of optical conversion material 74 can be applied directly over the one or more LED chips 16. Optical conversion material 74 can also be disposed on or in a portion of the domed lens for producing cool and/or warm white output.

In one aspect, optical element 72 can comprise a liquid curable silicone material, an epoxy material, or any encapsulant material such as a methyl or phenyl based encapsulant material formed as a lens. The lens can be molded and cured using known processes. Optical element 72 can be formed directly and/or indirectly over a top surface of submount 12/42, and can be disposed over at least one LED chip 16. An array of lenses or optical elements 72 can be molded and/or positioned over a corresponding array of LED chips 16. Optical element 72 can provide both environmental and/or mechanical protection of light emitter component 70.

In some aspects, a reflective material or reflective layer 78 of material can be provided within a portion of submount 12/42, for example, below LED chips 16. For example, and in some aspects a Ag reflective component or Ag layer can be provided and/or buried within portions of submount 12/42 at a level below chips 16. In some aspects, the Ag, reflective layer or component can be provided along a bottom of surface of submount 12/44 as indicated. The reflective material and/or reflective layer 78 can advantageously reflect light (versus index-scattering), thus, it can be mirror like and improve brightness and light extraction from component 70. Reflective layer 78 can also improve heat spreading ability within component 70 and/or can be used as a conductive trace for electrical connectivity. Reflective layer 78 can be, but does not have to be, applied over and/or within portions of submount 12/44 via electroplating and/or electroless plating techniques. In other aspects, Ag fragments or planes of polished Ag can be buried within portions of submount 12/44.

Embodiments of the present disclosure shown in the drawings and described above are exemplary of numerous embodiments that can be made within the scope of the appended claims. It is contemplated that the novel light emitter components having improved light extraction and methods of making the same can comprise numerous configurations other than those specifically disclosed. It is also contemplated that the novel submounts and/or embedded LED chips disclosed herein for providing improved light extraction and desired beam patterns or beam shaping via controlling submount materials can also comprise numerous configurations other than those specifically described.

What is claimed is:

1. A light emitter component comprising:
   a submount comprising ceramic; and
   at least one light emitting diode (LED) chip disposed within a portion of the submount;
   wherein the submount contacts at least two different light emitting sides of the at least one LED chip such that light emitted by the at least two different light emitting sides is emitted into the submount and reflected back out thereon.

2. The component according to claim 1, wherein the at least one LED chip is embedded within a portion of the submount.

3. The component according to claim 1, wherein the submount comprises one or more surface portions adapted to receive a portion of the at least one LED chip.

4. The component according to claim 3, wherein the one or more surface portions comprises a recess.

5. The component according to claim 3, wherein the one or more surface portions comprises a groove.

6. The component according to claim 1, wherein the ceramic based material comprises alumina.

7. The component according to claim 1, wherein the submount comprises a first layer of material and a second layer of material.

8. The component according to claim 7, wherein the first layer of material comprises a ceramic plate of alumina, and wherein the second layer of material comprises light scattering particles disposed in a matrix material.

9. The component according to claim 8, wherein the light scattering particles comprise one or more particles of Al2O3, TiO2, BaSO4, and/or AlN.

10. The component according to claim 8, wherein the light scattering particles are loaded between approximately 3 weight percent (wt. %) and approximately 50 wt. % within the matrix material.

11. The component according to claim 10, wherein the light scattering particles are uniformly loaded within portions of submount.

12. The component according to claim 10, wherein the light scattering particles are variably loaded within portions submount.

13. The component according to claim 1, wherein a reflective material is provided within a portion of submount.

14. The component according to claim 13, wherein the reflective material is provided below a portion of the LED chip.

15. The component according to claim 13, wherein the reflective material is applied to a bottom surface of submount.

16. The component according to claim 13, wherein the reflective material comprises silver.

17. A light emitter component comprising:
a submount comprising ceramic; and
at least one light emitting diode (LED) chip having multiple light emitting surfaces embedded within a portion of the submount;
wherein the submount is adapted to receive light emitted by the multiple light emitting surfaces and reflect the light back out thereon via one or more light reflecting areas disposed within the submount.

18. The component according to claim 17, wherein the submount contacts the LED chip in at least two points.

19. The component according to claim 17, wherein the submount contacts the LED chip in at least three points.

20. The component according to claim 17, wherein the submount contacts the LED chip in at least four points.

21. The component according to claim 17, wherein the submount contacts the LED chip in at least five points.

22. The component according to claim 17, wherein the submount contacts the LED chip in at least six points.

23. The component according to claim 17, wherein the ceramic based material comprises alumina.

24. The component according to claim 17, wherein the submount comprises a first layer of material and a second layer of material.

25. The component according to claim 24, wherein the first layer of material comprises a ceramic plate of alumina, and wherein the second layer of material comprises light scattering particles disposed in a matrix material.

26. The component according to claim 25, wherein the light scattering particles comprise one or more particles of Al2O3, TiO2, BaSO4, and/or AlN.

27. The component according to claim 25, wherein the light scattering particles comprise a variable packing density within portions submount such that at least a first area of the submount is more densely loaded with light scattering particles than a second area.

28. The component according to claim 17, wherein a reflective material is provided within a portion of submount.

29. The component according to claim 28, wherein the reflective material is applied to a bottom surface of submount.

30. The component according to claim 28, wherein the reflective material comprises silver.

31. A submount comprising:
a body comprising ceramic; and
a surface feature disposed in the body, wherein the surface feature is adapted to receive a portion of a light emitting diode (LED) chip and contact multiple light emitting surfaces of the LED chip; wherein light emitted by the light emitting surfaces are emitted from the body by light reflecting areas internally disposed within the body.

32. The submount according to claim 31, wherein the surface feature comprises a recess.

33. The submount according to claim 31, wherein the surface feature comprises a groove.

34. The submount according to claim 33, wherein the groove comprises a V-shaped cross section.

35. The submount according to claim 31, wherein at least a portion of the submount comprises alumina.

36. The submount according to claim 31, wherein the submount comprises a first layer of material and a second layer of material.

37. The submount according to claim 36, wherein the first layer of material comprises a ceramic plate of alumina, and wherein the second layer of material comprises light scattering particles disposed in a matrix material.

38. The submount according to claim 37, wherein the light scattering particles comprise one or more particles of Al2O3, TiO2, BaSO4, and/or AlN.

39. The submount according to claim 31, wherein the submount comprises optical conversion materials dispersed within the ceramic based body of material.

40. The submount according to claim 31, further comprising a reflective material buried within a portion of the submount.

41. The submount according to claim 40, wherein the reflective material is provided below a portion of the LED chip.

42. The component according to claim 40, wherein the reflective material is applied to a bottom surface of the submount.

43. The component according to claim 40, wherein the reflective material comprises silver.

* * * * *